United States Patent
Liou et al.

(10) Patent No.: US 10,510,586 B1
(45) Date of Patent: Dec. 17, 2019

(54) MULTI-LAYER STRUCTURE HAVING A DENSE MIDDLE LAYER

(71) Applicant: Taiwan Semiconductor Manufacturing Company, Ltd., Hsinchu (TW)

(72) Inventors: Joung-Wei Liou, Zhudong Town (TW); Chin Kun Lan, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/124,324

(22) Filed: Sep. 7, 2018

(51) Int. Cl.
| | | |
|---|---|---|
| *H01L 21/768* | (2006.01) | |
| *H01L 21/033* | (2006.01) | |
| *H01L 21/311* | (2006.01) | |
| *H01L 21/02* | (2006.01) | |
| *H01L 21/3213* | (2006.01) | |

(52) U.S. Cl.
CPC .... *H01L 21/76816* (2013.01); *H01L 21/0228* (2013.01); *H01L 21/02126* (2013.01); *H01L 21/02211* (2013.01); *H01L 21/02274* (2013.01); *H01L 21/0332* (2013.01); *H01L 21/0337* (2013.01); *H01L 21/31116* (2013.01); *H01L 21/31144* (2013.01); *H01L 21/32136* (2013.01); *H01L 21/32139* (2013.01); *H01L 21/76877* (2013.01); *H01L 21/7684* (2013.01); *H01L 21/76847* (2013.01)

(58) Field of Classification Search
CPC ........... H01L 21/76816; H01L 21/0332; H01L 21/31144; H01L 21/02274; H01L 21/31116; H01L 21/32136; H01L 21/0337; H01L 21/32139; H01L 21/02126; H01L 21/0228; H01L 21/02211; H01L 21/76877; H01L 21/76847; H01L 21/7684
See application file for complete search history.

(56) References Cited

U.S. PATENT DOCUMENTS

| | | | | |
|---|---|---|---|---|
| 4,761,464 A | * | 8/1988 | Zeigler | ............... C08G 77/48 430/269 |
| 2009/0191711 A1 | * | 7/2009 | Rui | ...................... G03F 7/40 438/695 |
| 2014/0145313 A1 | * | 5/2014 | Li | .................. H01L 21/31116 257/635 |

* cited by examiner

*Primary Examiner* — Karen Kusumakar
(74) *Attorney, Agent, or Firm* — Slater Matsil, LLP

(57) ABSTRACT

An embodiment is a method of fabricating a semiconductor structure. The method includes depositing a hard mask. A multi-layer structure is deposited over the hard mark. The multi-layer structure includes a bottom layer, a first middle layer over the bottom layer, a second middle layer over the first middle layer, and a top layer over the second middle layer. The first middle layer comprises a $SiC_xH_yO_z$ material in which the $SiC_xH_yO_z$ material has a silicon-to-silicon bond content in a range from about 0.5% to about 5%. The multi-layer structure is patterned to form a patterned first middle layer having openings. The hard mask is etched through the openings in the patterned first middle layer.

20 Claims, 11 Drawing Sheets

MULTI-LAYER STRUCTURE HAVING A DENSE MIDDLE LAYER

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreasing geometry sizes may lead to various manufacturing difficulties. For example, a tri-layer structure is commonly used to pattern layers in semiconductor processes. However, as the device sizes become smaller and smaller, the use of tri-layer structures may cause over etching or under etching of structure layers, which may degrade semiconductor device performance or even lead to device failures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
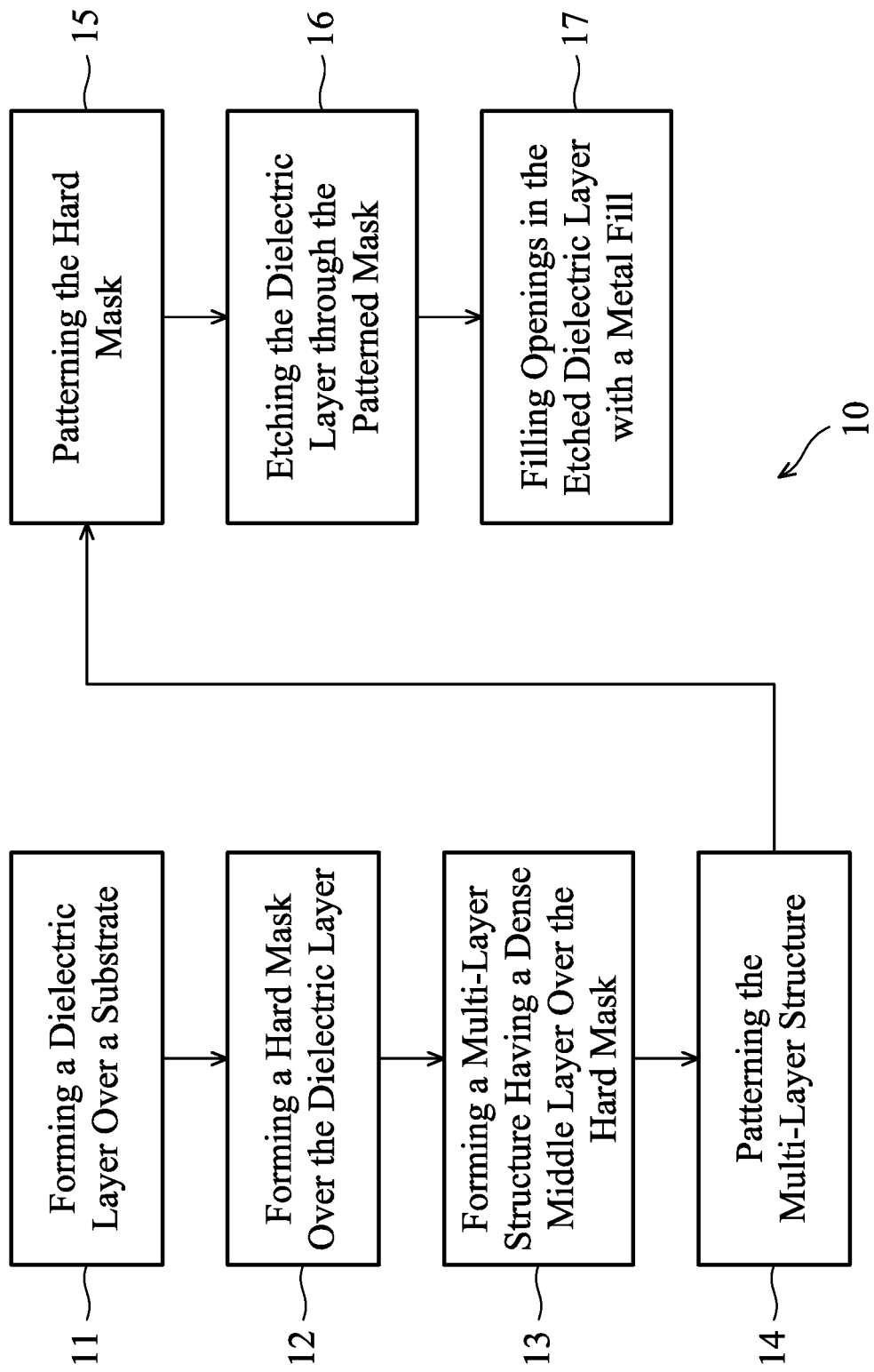
FIG. 1 depicts an exemplary flow diagram of a process to form a multi-layer structure in a multi-etching process to pattern a hard mask, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments as described herein are directed to a multiple patterning method for forming conductive features having a small pitch. A multi-layer structure, such as a tetra-layer structure, is provided. The multi-layer structure includes a dense middle layer comprising a $SiC_xH_yO_z$ material. The dense middle layer provides high etch selectivity in comparison to a bottom layer of the multi-layer structure. The multi-layer structure may be used to pattern a hard mask, such as a multi-layer hard mask. The multi-layer structure including a dense middle layer reduces over etching and/or under etching issues of patterning the multi-layer structure caused by loading differences of the multi-layer structure over various areas of the substrate having different density of features. Hence, some embodiments may improve patterning of structures with different widths. The multi-layer structure including a dense middle layer reduces pattern bridges or missing patterns of subsequent patterning operations.

FIG. 1 depicts an exemplary flow diagram of a process 10 to form a multi-layer structure in a multi-etching process to pattern a hard mask, such as a multi-layer structure and a multi-layer hard mask described with respect to FIG. 2 through FIG. 10. FIG. 2 through FIG. 10 are schematic cross-sectional views of a portion of a substrate corresponding to various stages of the process 10, in accordance with some embodiments. The process 10 may be utilized to form any suitable structures, including the structures depicted in FIG. 2 through FIG. 10 or in other applicable semiconductor structures.

Figure 2:
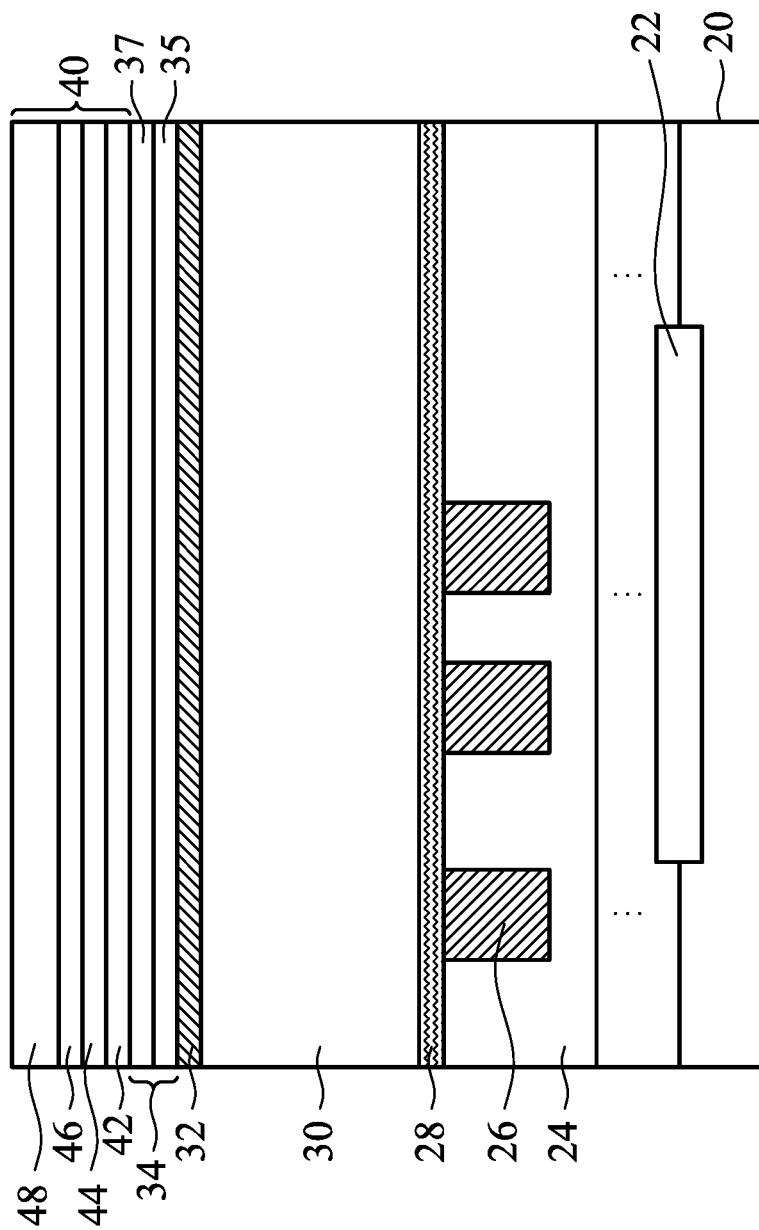
FIG. 2 is cross-sectional view of a portion of a substrate having a multi-layer structure over a multi-layer hard mask, in accordance with some embodiments.

As shown in FIG. 2, the structure includes a substrate 20, which is part of a device die, in accordance with some embodiments. The substrate 20 can be or include a bulk semiconductor substrate, a semiconductor-on-insulator (SOI) substrate, or another substrate. The semiconductor material of the substrate 20 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 20, the substrate 20 may include semiconductor material disposed on an insulator layer, which may be a buried insulator disposed in a semiconductor substrate, or which may be a glass or sapphire substrate. In certain embodiments, the substrate 20 is a silicon wafer. For example, the substrate 20 may be a round substrate having a 200 mm diameter, a 300 mm diameter, a 450 mm diameter, or other diameters. In other embodiments, the substrate 20 may be any particular size, shape, or materials. For example, the substrate 20 may also be any polygonal, square, rectangular, curved, or otherwise non-circular workpiece.

The substrate 20 may include devices 22, such as transistors, diodes, capacitors, inductors, resistors, other active devices, and/or other passive devices. The devices 22 may be formed over the substrate 20, may extend into the substrate 20, and/or may extend through the substrate 20.

A first dielectric layer 24, which may be an inter-layer dielectric (ILD) layer or an inter-metal dielectric (IMD) layer, is formed over the devices 22. The first dielectric layer 24 includes a dielectric material, such as silicon oxide, un-doped silicate glass, doped silicon oxide such as borophosphosilicate glass (BPSG), fluorinated silicate glass (FSG), phosphosilicate glass (PSG), boron doped silicon glass (BSG), and/or other suitable dielectric materials. The first dielectric layer 24 may be deposited by a plasma enhanced chemical vapor deposition (PECVD) process, a high-density plasma CVD (HDP-CVD) process, or other suitable deposition processes. For example, the first dielectric layer 24 may include silicon oxide formed using a tetraethylorthosilicate (TEOS) precursor in a PECVD process.

Conductive features 26, such as gate structures, metal lines, metal contact plugs, metal vias, and/or other features, are formed in the first dielectric layer 24. For example, each conductive feature 26 may include a diffusion barrier layer and a metal fill over the diffusion barrier layer. Examples of a diffusion barrier layer include titanium, titanium nitride, tantalum, tantalum nitride, other suitable barrier materials, and multiple layers thereof. Examples of a metal fill include copper, tungsten, and other conductive materials. The conductive features 26 may be deposited by a physical vapor deposition (PVD) process, an electrochemical deposition process, a CVD process, other suitable deposition processes, or combinations thereof.

An etch stop layer (ESL) 28 may be formed over the first dielectric layer 24. The ESL 28 can provide a mechanism to stop an etch process when forming contacts, vias, or other features by having a different etch selectivity from adjacent layers or components. The ESL 28 may include or be aluminum nitride, silicon nitride, silicon carbon nitride, silicon carbon oxide, carbon nitride, the like, or a combination thereof. The ESL 28 may be deposited by a PECVD process, a HDP-CVD process, an atomic layer deposition (ALD) process, or other suitable deposition processes.

At operation 11 of the process 10 of FIG. 1, a second dielectric layer 30 is formed over the ESL 28 as shown in FIG. 2. In accordance with some embodiments, the second dielectric layer 30 includes a low-k dielectric material. The second dielectric layer 30 may include silicon oxide, un-doped silicate glass, doped silicon oxide such as borophosphosilicate glass (BPSG), fluorinated silicate glass (FSG), phosphosilicate glass (PSG), boron doped silicon glass (BSG), and/or other suitable dielectric materials. The second dielectric layer 30 may be deposited by a PECVD process, a HDP-CVD process, or other suitable deposition processes. For example, the second dielectric layer 30 may include silicon oxide formed using a tetraethylorthosilicate (TEOS) precursor in a PECVD process.

An anti-reflective coating (ARC) layer 32 may be formed over the second dielectric layer 30. The ARC layer 32 may include a silicon oxycarbide, a silicon oxide, a nitrogen-free material, or other suitable materials. The ARC layer 32 may be deposited by PECVD or other suitable deposition processes.

At operation 12, a hard mask 34 is formed over the ARC layer 32. The hard mask 34 may be deposited by a CVD process, a PVD process, an ALD process, a spin-on process, other suitable deposition processes, or a combination thereof. In certain embodiments, the hard mask 34 includes a multi-layer hard mask. In certain embodiments, the multi-layer hard mask 34 includes an intermetal layer 35 and a silicon-containing layer 37 over the intermetal layer 35. The intermetal layer 35 may include a titanium nitride layer, a titanium oxide layer, a tantalum nitride layer, other suitable metal layers, or combinations thereof. In certain embodiments, the intermetal layer 35 is a titanium nitride layer. The silicon-containing layer 37 may include a silicon oxide ($SiO_x$) layer, a silicon oxycarbide ($SiO_xC_y$) layer, a silicon carbon nitride ($SiC_xN_y$) layer, a silicon carbon ($SiC_x$) layer, a silicon nitride ($SiN_x$) layer, a polymer photoresist layer, or combinations thereof. In certain embodiments, the silicon-containing layer 37 is a $SiO_x$ layer. In certain embodiments, the silicon-containing layer 37 is deposited by a CVD process using TEOS as a process gas.

At operation 13, a multi-layer structure 40 is formed over the hard mask 34. In certain embodiments, the multi-layer structure 40 includes a bottom layer 42, a dense middle layer 44 over the bottom layer 42, and a top layer 48 over the dense middle layer 44. The term "dense middle layer" as used herein refers to a $SiC_xH_yO_z$ layer having a silicon-to-silicon bond content in a range from about 0.5% to about 5% in relation to the total silicon bonds (e.g., silicon-to-oxygen bonds, silicon-to-carbon bonds, and silicon-to-silicon bonds). In certain embodiments, the multi-layer structure 40 further includes a soft middle layer 46 over the dense middle layer 44 and under the top layer 48 as shown in FIG. 2. The term "soft middle layer" as used herein refers to a $SiC_xH_yO_z$ layer having a silicon-to-silicon bond content less than 0.5%, The bottom layer 42 of the multi-layer structure 40 is formed over the hard mask 34. The bottom layer 42 includes a $C_xH_yO_z$ material, silicon oxide ($SiO_x$), silicon oxycarbide ($SiO_xC_y$), a polymer material, or other suitable materials. The bottom layer 42 may be deposited by a CVD process, an evaporation process, a spin-on process, other suitable deposition processes, or a combination thereof.

The dense middle layer 44 is formed over the bottom layer 42. The dense middle layer 44 includes a $SiC_xH_yO_z$ material deposited by a CVD process or an ALD process, such as a PECVD process or a plasma enhanced ALD process. In certain embodiments, the $SiC_xH_yO_z$ material of the dense middle layer 44 has a silicon-to-silicon bond content in a range from about 0.5% to about 5%, a silicon-to-oxygen bond content in a range from about 83% to about 90%, and a silicon-to-carbon bond content in a range from about 10 percent to about 18% in relation to the total silicon bonds (e.g., silicon-to-oxygen bonds, silicon-to-carbon bonds, and silicon-to-silicon bonds).

In a CVD process, deposition of the dense middle layer 44 of $SiC_xH_yO_z$ includes flowing a silicon precursor, a carbon precursor, and an oxygen precursor. The silicon precursor is silane ($SiH_4$), disilane ($Si_2H_4$), trisilane ($Si_3H_8$), or combinations thereof. The carbon precursor is tetraethyl orthosilicate (TEOS), dimethyldiethoxysilane (mDEOS), methane ($CH_4$), ethane ($C_2H_6$), propane ($C_3H_8$), α-Terpinene, trimethylsilane ($C_3H_{10}Si$), tetramethylsilane ($C_4H_{12}Si$), benzene ($C_6H_6$), other carbon precursors, or combinations thereof. The oxygen precursor is oxygen ($O_2$), carbon dioxide ($CO_2$), nitrous oxide ($N_2O$), or combinations thereof. Additional carrier or process gases may also be flowed, such as argon (Ar), nitrogen ($N_2$), helium (He), and/or hydrogen ($H_2$) gas. In certain embodiments, the dense middle layer 44 is deposited by a PECVD process at a process temperature in a range from about 50° C. to about 350° C. If a temperature of less than 50° C. is used, the deposition rate of the dense middle layer 44 may be low. If a temperature of greater than 350° C. is used in a PECVD process, the quality of the dense middle layer 44 may be poor. The process pressure is in a range from about 0.5 torr to about 20 torr. If a process pressure less than about 0.5 torr is used in a PECVD process, the deposition rate of the dense middle layer 44 may be low. If a process pressure greater than about 20 torr is used in a PECVD process, the plasma may be unstable.

In an ALD process, deposition of the dense middle layer 44 includes multiple cycles of flowing precursors. For example, each cycle includes providing a pulse of a first precursor and a pulse of a second precursor. A pulse of a purge gas between the pulses of the first precursor and the second precursor may help to remove excess precursors from the surface of the substrate to help provide controlled growth. Instead of a pulse of a purge gas, a pump down of sufficient duration between the pulse of the first precursor and the second precursor may be used to help to remove excess precursors on the surface of the substrate to help provide controlled growth. In certain embodiments, a plasma may also be provided. For example, the first precursor includes bis-diethylamino-silane ($SiH_2[N(C_2H_5)_2]_2$) or other silicon-carbon precursors. The second precursor includes oxygen ($O_2$), nitrous oxide ($N_2O$), or other oxygen precursors. The second precursor may be provided as a plasma, such as utilizing a remote plasma source. The second precursor may be provided as a plasma in a duration in a range from about 0.1 seconds to about 5 seconds for each pulse of an atomic layer deposition cycle. The purge gas includes argon (Ar), nitrogen ($N_2$), helium (He), hydrogen ($H_2$), or other gases. In certain embodiments, each cycle may form about a monolayer or atomic layer of $SiC_xH_yO_z$. In other embodiments, each cycle may form less than a monolayer due to partial adsorption or partial reaction of the precursors. In other embodiments, each cycle may form more than a monolayer due to only partial or no removal of excess precursors on the surface of the substrate.

In certain embodiments, the dense middle layer 44 includes a $SiC_xH_yO_z$ material having a silicon-to-silicon bond content in a range from about 0.5% to about 5%. In certain aspects, a $SiC_xH_yO_z$ material having a silicon-to-silicon bond content in a range of about 5% or less has reduced delamination/peeling and reduced alignment failure during the lithography process in comparison to a $SiC_xH_yO_z$ material having a silicon-to-silicon bond content in a range of greater than about 5%. In certain aspects, a $SiC_xH_yO_z$ material having a silicon-to-silicon bond content of about 0.5% or greater showed a good etch selectivity in comparison to the bottom layer 42. A $SiC_xH_yO_z$ material having a silicon-to-silicon bond content of less than 0.5% or with no silicon-to-silicon bond content may undesirably result in over etching the bottom layer 42 during an etch of the dense middle layer 44.

In certain embodiments, the dense middle layer 44 includes a $SiC_xH_yO_z$ material having an atomic percent content of carbon in a range from about 0.5% to about 10% to provide a more flowable film capable of filling gaps. A $SiC_xH_yO_z$ layer having an atomic percent content of carbon of less than 0.5% or no carbon content may undesirably form voids. A $SiC_xH_yO_z$ layer having an atomic percent content of carbon over 10% provides a material having a low etch selectivity in comparison to the bottom layer 42. In certain embodiments, the dense middle layer 44 includes a $SiC_xH_yO_z$ material deposited to a thickness in a range from about 50 Å to about 300 Å. A $SiC_xH_yO_z$ layer having a thickness of less than 50 Å may be undesirably etched away when used as a mask resulting in poor pattern transfer. A $SiC_xH_yO_z$ layer having a thickness of more than 300 Å may form openings with an undesirable high aspect ratio resulting in difficulty forming subsequent features, such as conductive features, having a narrow pitch.

In certain embodiments, the soft middle layer 46 includes a $SiC_xH_yO_z$ material. The soft middle layer 46 is deposited by a CVD process, an evaporation process, a spin-on process, other suitable deposition processes, or a combination thereof. The soft middle layer 46 includes a $SiC_xH_yO_z$ material having a silicon-to-silicon bond content less than 0.5%, such as in a range from zero to 0.2%. In certain embodiments, the $SiC_xH_yO_z$ material of the soft middle layer 46 has a silicon-to-silicon bond content in a range from about 0% to about 0.5%, a silicon-to-oxygen bond content in a range from about 80% to about 90%, and a silicon-to-carbon bond content in a range from about 10 percent to about 20% in relation to the total silicon bonds (e.g., silicon-to-oxygen bonds, silicon-to-carbon bonds, and silicon-to-silicon bonds).

The top layer 48 includes a $C_xH_yO_z$ material and a photo-sensitive element, such as a photo-acid generator (PAG) or a photo-base generator (PBG). In certain embodiments, the top layer 48 includes a $SiC_xH_yO_z$ material. In certain embodiments, the $SiC_xH_yO_z$ material of the top layer 48 includes a silicon-containing alkyl group. In certain embodiments, the $SiC_xH_yO_z$ material of the top layer 48 has a silicon-oxygen-silicon backbone. In certain embodiments, the $SiC_xH_yO_z$ material of the top layer 48 has a silicon-to-silicon bond content in a range from about 0.5% to about 5% in relation to the total silicon bonds (e.g., silicon-to-oxygen bonds, silicon-to-carbon bonds, and silicon-to-silicon bonds). Examples of PAGs include, but are not limited to, halogenated triazines, onium salts, diazonium salts, aromatic diazonium salts, or combinations thereof. The top layer 48 is deposited by a spin coating process, a CVD process, an ALD process, an evaporation process, or any suitable deposition technology.

At operation 14, the multi-layer structure 40 is patterned. In certain embodiments in which the multi-layer structure 40 includes a bottom layer 42, a dense middle layer 44 over the bottom layer 42, and a top layer 48 over the dense middle layer 44, patterning the multi-layer structure 40 includes a photolithography process to pattern the top layer 48, a first etch process to pattern the dense middle layer 44, and a second etch process to pattern the bottom layer 42 for embodiments.

In certain embodiments in which the multi-layer structure 40 includes a bottom layer 42, a dense middle layer 44 over the bottom layer 42, a soft middle layer 46 over the dense middle layer 44, and a top layer 48 over the soft middle layer 46, patterning the multi-layer structure 40 includes a photolithography process to pattern the top layer 48, a first etch process to pattern the soft middle layer 46 and the dense middle layer 44, and a second etch process to pattern the bottom layer 42. In other embodiments, patterning the multi-layer structure 40 includes a photolithography process to pattern the top layer 48, a descum process to pattern the soft middle layer 46, a first etch process to pattern the dense middle layer 44, and a second etch process to pattern the bottom layer 42. In yet other embodiments, patterning the multi-layer structure 40 includes a photolithography process to pattern the top layer 48, a first etch process to pattern the soft middle layer 46, a second etch process to pattern the dense middle layer 44, and a third etch process to pattern the bottom layer 42.

Figure 3:
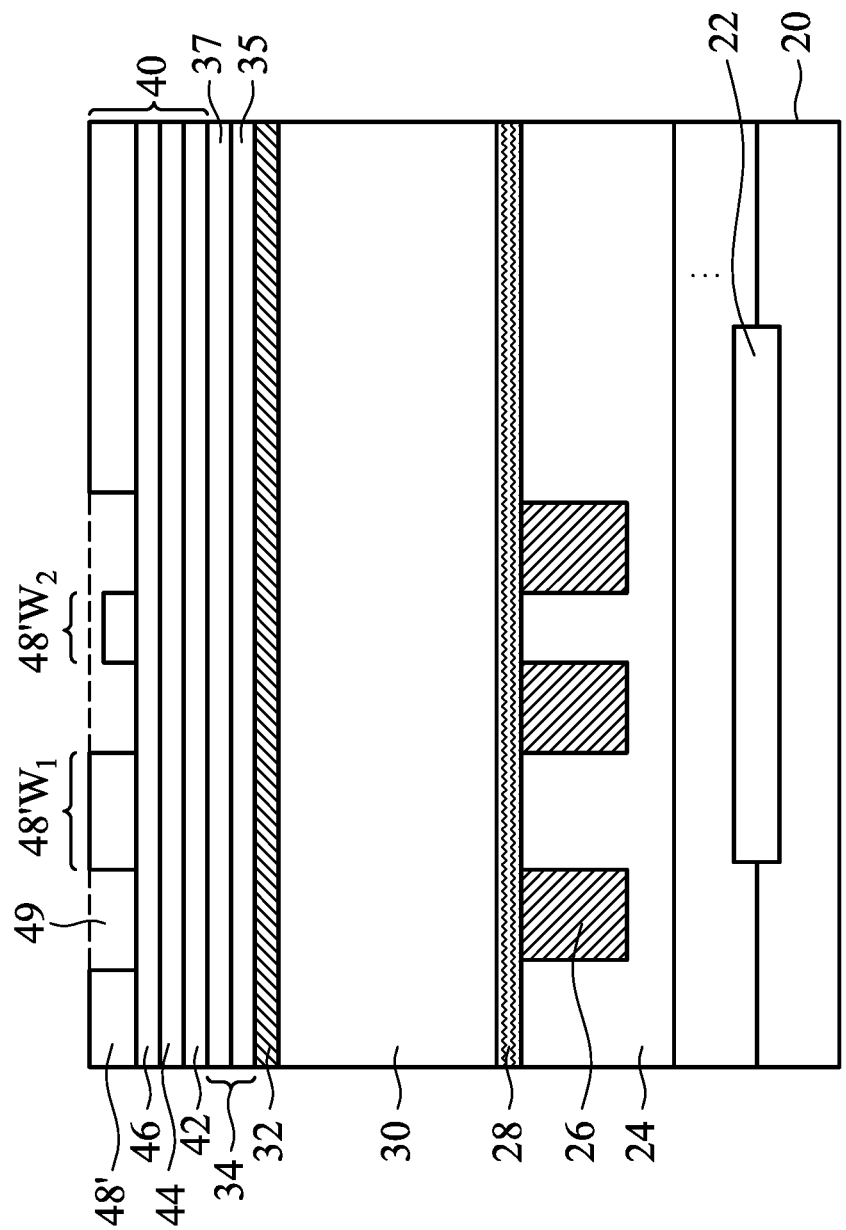
FIGS. 3, 4, 5A, 5B, and 6 through 10 are cross-sectional views of intermediate stages during a process implementing a patterned multi-layer structure, in accordance with some embodiments.

The top layer 48 is patterned (i.e., exposure and development) to form openings 49 in the patterned top layer 48' as shown in FIG. 3, in accordance with some embodiments. A dotted line schematically represents the removal of portions of the top layer 48 to form the openings 49. The openings 49 may have a pattern of a via, a contact, or another feature to be formed in the second dielectric layer 30 in subsequent operations. The patterned top layer 48' may include patterns 48'W with different widths. For example, pattern 48'W$_1$ is formed to a greater width than pattern 48'W$_2$ as shown in FIG. 3. Due to the narrower width of pattern 48'W$_2$, the height of pattern 48'W$_2$ may be shorter than 48'W$_1$.

The top layer 48 may be patterned using any suitable photolithography technique. For example, a photomask (not shown) may be disposed over the top layer 48, which may then be exposed to a radiation beam including an ultraviolet (UV) or an excimer laser such as a 248 nm beam from a Krypton Fluoride (KrF) excimer laser, or a 193 nm beam from an Argon Fluoride (ArF) excimer laser. In another example, a reflective EUV mask may be used to reflect a pattern from an EUV light source directed through optics to the EUV mask and then to the substrate to expose a pattern onto the top layer 48. The top layer 48 may undergo a baking process, such as a soft pre-exposure bake to remove solvent used during deposition and/or a post exposure bake to promote adhesion and/or cross-linking induced by an exposure. For example, a soft pre-exposure bake is conducted at a temperature of 250° C. or less to remove solvent without inducing cross-linking.

A developer may be used to remove either the exposed or unexposed portions of the top layer 48 depending on whether a positive or negative resist is used. Positive tone photoresist materials become soluble to developer when exposed to radiation. Negative tone resist materials become insoluble to developer when exposed to radiation. The developer may contain a quenching agent to quench the acid generated by the PAG or the base generated by the PBG.

Figure 4:
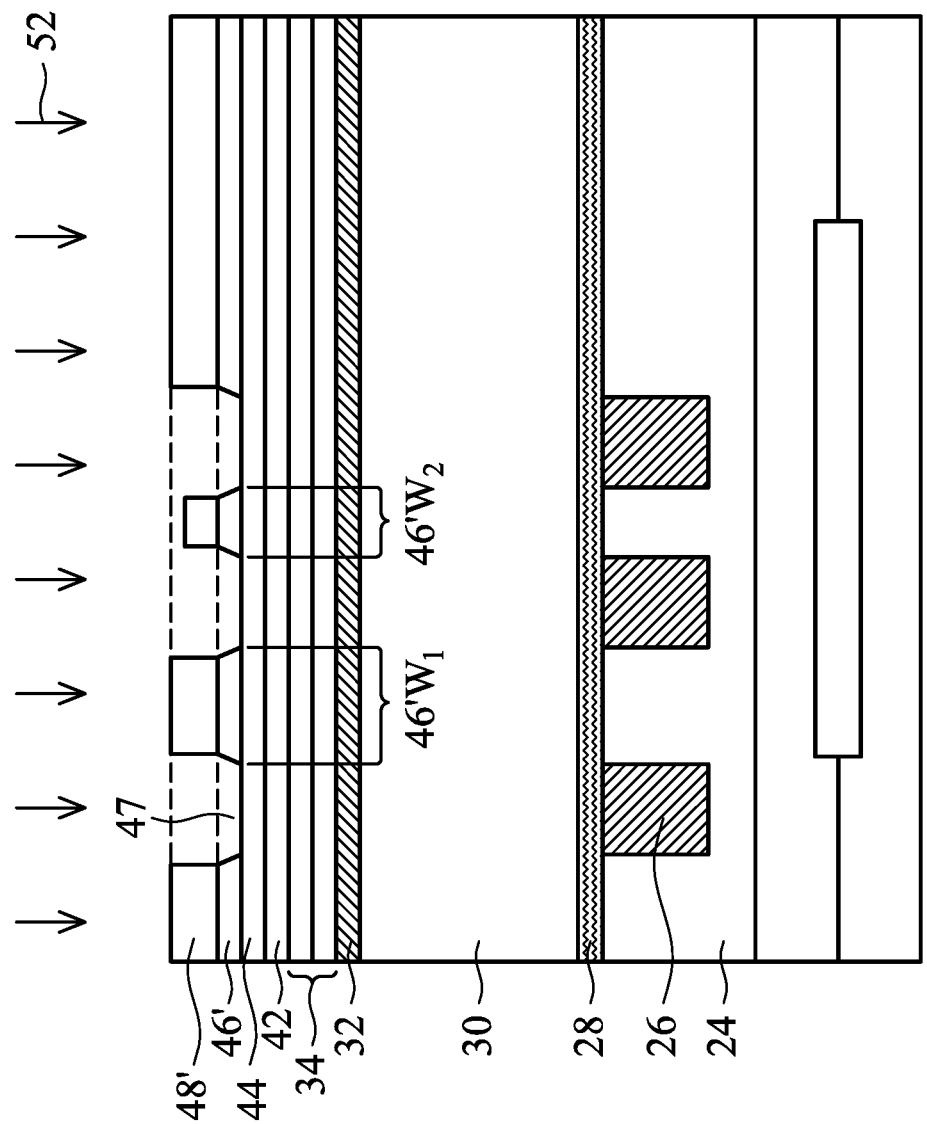

A descum process 52 is performed over the patterned top layer 48' as shown in FIG. 4, in accordance with some embodiments. The purpose of the descum process 52 is to remove residual material, undeveloped photoresist material, and/or photoresist scum which causes poor pattern transfer from the top layer 48 to the etched layer. Poor pattern transfer may cause undesirable line edge roughness and other undesirable lithography issues. The descum process 52 may include an oxygen plasma or other plasma to volatilize and to remove residual material, undeveloped photoresist material, and photoresist scum. In certain embodiments, the descum process 52 includes providing oxygen at a flow rate of between about 10 sccm and about 35 sccm at a chamber pressure between 10 mTorr and 125 mTorr at a plasma source power in a range from about 25 W to about 125 W. The descum process 52 may include different suitable parameters for the flow rate of gases, chamber pressure, plasma source power, and other process parameters.

In certain embodiments, the descum process 52 may partially etch the soft middle layer 46. In certain embodiments as shown in FIG. 4, the descum process 52 may etch through the soft middle layer 46 to form a patterned soft middle layer 46' having openings 47. The soft middle layer 46 is etched through the openings 49 in the patterned top layer 48' to form openings 47 to expose the dense middle layer 44. Due to the greater silicon-to-silicon bonds of the dense middle layer 44, the descum process 52 has a higher etch selectivity to the soft middle layer 46 than the dense middle layer 44. A dotted line schematically represents the removal of portions of the soft middle layer 46 to form the openings 47. The patterned soft middle layer 46' may include patterns 46'W with different widths. For example, pattern 46'W$_1$ is formed to a greater width than patterning 46'W$_2$ as shown in FIG. 4.

Figure 5A:
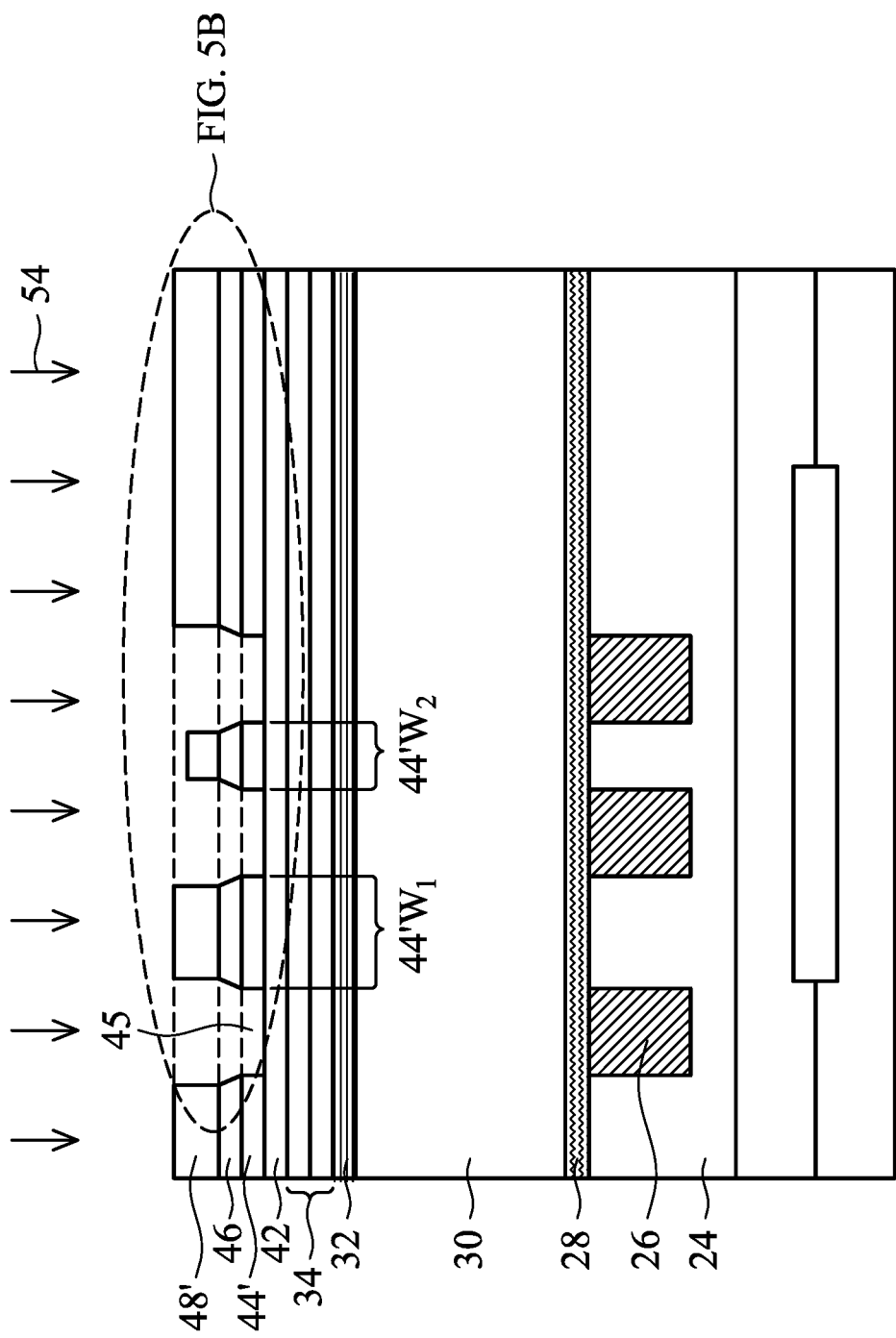

An etch process 54 is performed on the dense middle layer 44 using the patterned top layer 48' as an etching mask as shown in FIG. 5A, in accordance with some embodiments. The dense middle layer 44 is patterned (e.g., etched) to form openings 45 in the patterned dense middle layer 44', in accordance with some embodiments. The dense middle layer 44 is etched through the openings 49 in the patterned top layer 48' to form openings 45 in the patterned dense middle layer 44' to expose the bottom layer 42. A dotted line schematically represents the removal of portions of the dense middle layer 44 to form the openings 45. In certain embodiments if the soft middle layer 46 was only partially etched at the descum process 52, the etch process 54 etches through the soft middle layer 46 to form the patterned dense middle layer 44'. During the etch process 54 of the dense middle layer 44, the patterned top layer 48 may be partially or entirely consumed. The patterned dense middle layer 44' may include patterns 44'W with different widths. For example, pattern 44'W$_1$ is formed to a greater width than patterning 44'W$_2$ as shown in FIGS. 5A and 5B.

The etch process 54 may involve a plasma process, such as an inductively coupled plasma (ICP), parallel plate plasma, ion beam etching (IBE), or reactive ion beam etching (RIBE) plasma process. The etch process 54 includes an etching gas, such as oxygen ($O_2$), nitrogen ($N_2$), argon (Ar), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), sulfur hexafluoride ($SF_6$), nitrogen trifluoride ($NF_3$), chlorine ($Cl_2$), HCl (hydrogen chloride), $BCl_3$ (boron trichloride), other suitable reactive gases, or combinations thereof. The etching process may be an anisotropic etch forming substantially vertical sidewalls to the openings 45 in the patterned dense middle layer 44'. For example, an anisotropic etch may be achieved by applying a bias to the substrate during etching and/or by directing etch ions in an IBE or RIBE etch vertically towards the substrate. In certain embodiments, the etch process 54 includes providing an etching gas at a pressure in a range from about 5 mTorr to about 20 mTorr with a plasma power in a range from about 400 W to about 1000 W with a substrate bias power in a range from about 50V to about 500V at a substrate temperature in a range from about 20° C. to about 80° C. The etch process 54 may include different suitable parameters for the etch chamber pressure, plasma source power, substrate bias power, substrate temperature, and other process parameters.

The dense middle layer 44 has a high etch selectivity relative to the bottom layer 42 during the etch process 54 of the dense middle layer 44. In certain embodiments, the dense middle layer 44 has an etch selectivity of five (5) or more, such as fifteen (15) or more, or such as forty (40) or more, in comparison to the bottom layer 42 during the etch process 54 of the dense middle layer 44. The dense middle layer 44 is used as an etching mask for patterning the bottom layer 42. In certain embodiments, the high etch selectivity of the dense middle layer 44 helps to reduce over and/or under etching of the dense middle layer 44 and/or of the bottom layer 42 during etch process 54. In some instances, if the dense middle layer 44 has a low etch selectivity, then forming openings 45 in the dense middle layer 44 may also cause undesirably etching of the bottom layer 42. In other instances, if the dense middle layer 44 has a low etch selectivity, then formation of openings 45 in the dense middle layer 44 may be incomplete or under etched and may undesirably not expose the bottom layer 42 causing incomplete pattern transfer.

Figure 5B:
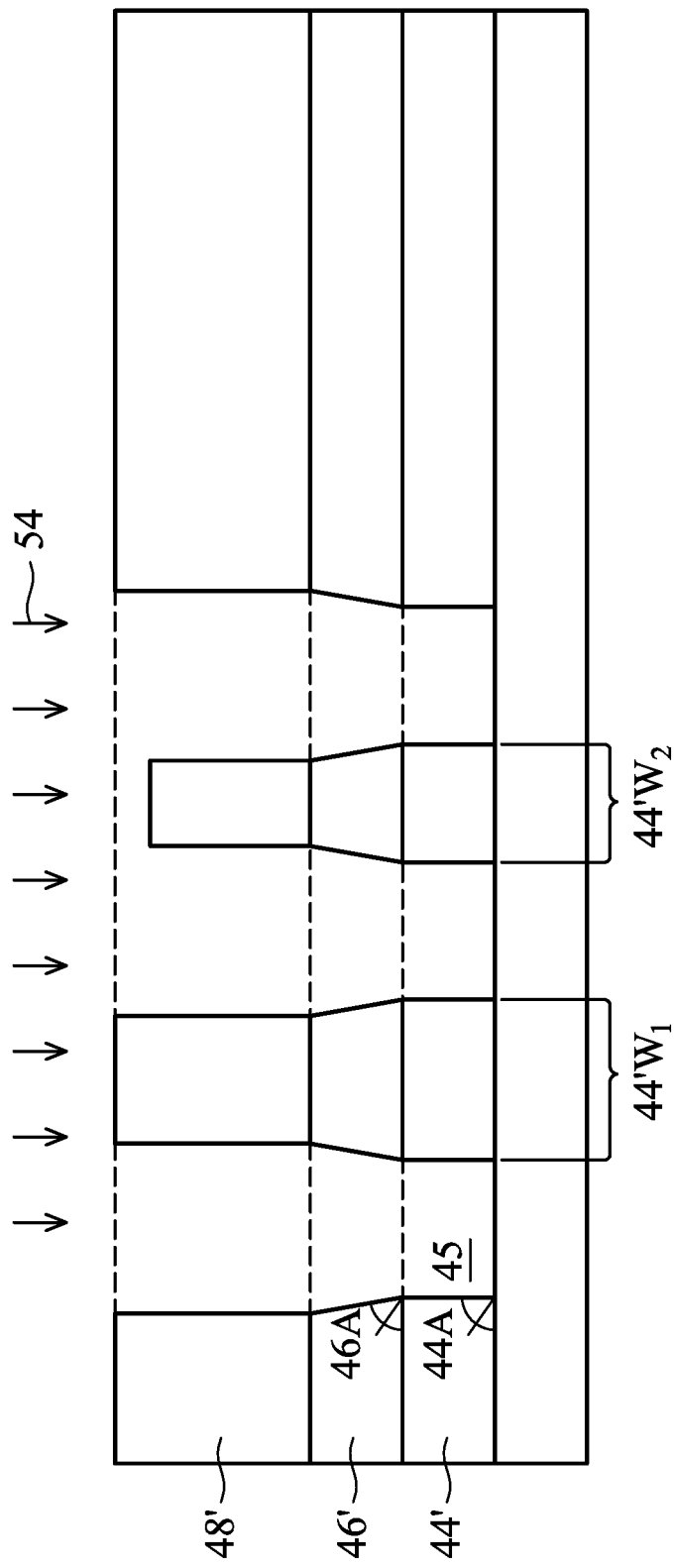

FIG. 5B is an enlarged view of FIG. 5A. Due to the low or no silicon-to-silicon bond content of the soft middle layer 46, openings 47 in the patterned soft middle layer 46' are formed with a sidewall taper angle 46A of about 65° or less. Due to the silicon-to-silicon bond content of the dense middle layer 44, openings 45 in the patterned dense middle layer 44' are formed with a sidewall taper angle 44A in the patterned dense middle layer 44' in a range from about 70° to about 90°, such as in a range from about 80° to about 90°. The silicon-to-silicon bond content of the dense middle layer 44 helps etch process 54 to anisotropically etch the dense middle layer 44. The sidewall taper angle 44A of the patterned dense middle layer 44' of less than 70° adversely impacts pattern transfer of subsequent patterning steps.

Figure 6:
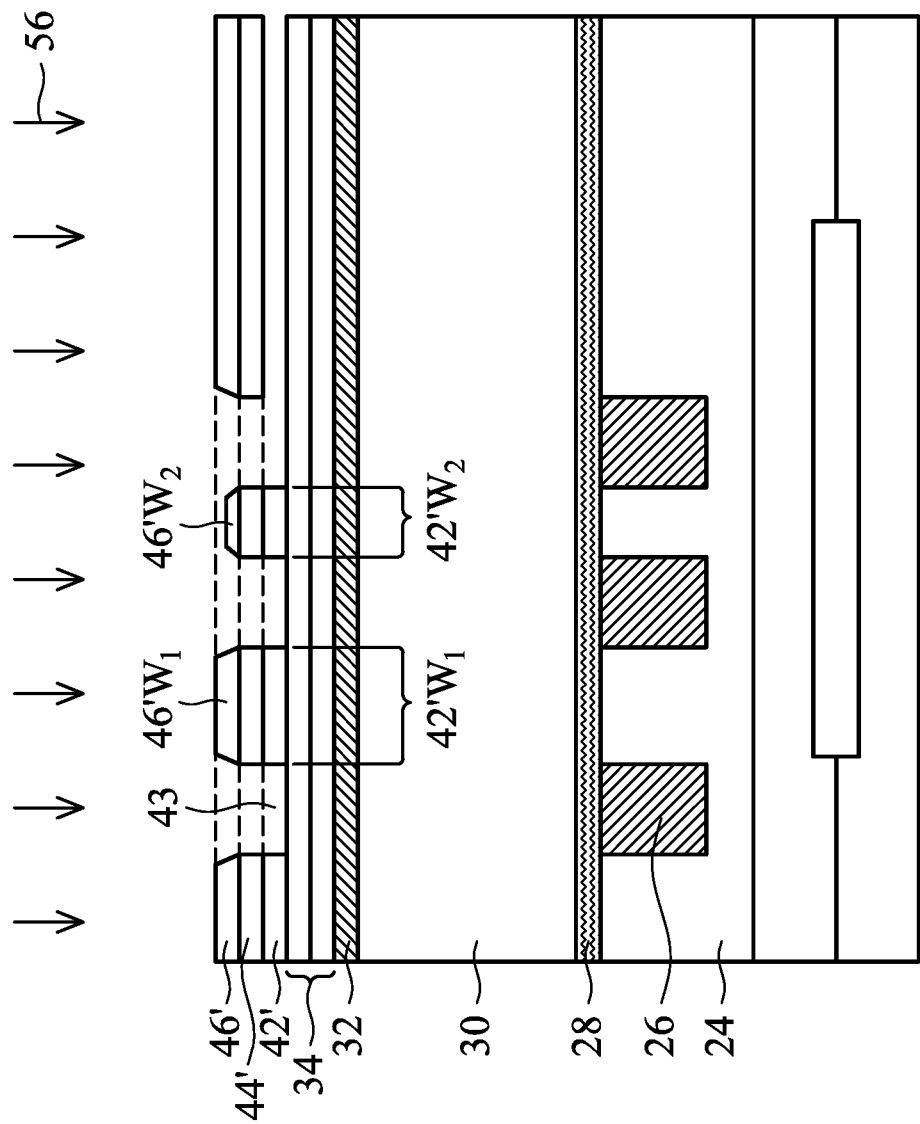

An etch process 56 is performed using the patterned dense middle layer 44' as an etching mask as shown in FIG. 6, in accordance with some embodiments. The etch process 56 may involve a plasma process, such as an inductively coupled plasma (ICP), parallel plate plasma, ion beam etching (IBE), or reactive ion beam etching (RIBE) plasma process. In certain embodiments, the etch process 56 includes providing etching gases, such as hydrogen bromide (HBr), $Cl_2$, $O_2$, $N_2$, or combinations thereof. In certain embodiments, the etch process 56 includes providing an etching gas at a pressure in a range from about 5 mTorr to about 20 mTorr with a plasma power in a range from about 400 W to about 1000 W with a substrate bias power in a range from about 50V to about 500V at a substrate temperature in a range from about 20° C. to about 80° C. The etch process 56 may include different suitable parameters for the etch chamber pressure, plasma source power, substrate bias power, substrate temperature, and other process parameters.

The bottom layer 42 is patterned (e.g., etched) to form openings 43 in the patterned bottom layer 42', in accordance with some embodiments. The bottom layer 42 is etched through the openings 45 in the patterned dense middle layer 44' to form openings 43 to expose the hard mask 34. A dotted line schematically represents the removal of portions of the bottom layer 42 to form the openings 43. During the etch process 56 of the bottom layer 42, the patterned soft middle layer 46' may be partially or entirely consumed. For example, due to the narrower width of pattern 46'$W_2$, the height of pattern 46'$W_2$ may be shorter than pattern 46'$W_1$. During the etch process 56, the patterned dense middle layer 44' remains. The patterned bottom layer 42' may include patterns 42'W with different widths. For example, pattern 42'$W_1$ is formed to a greater width than patterning 42'$W_2$ as shown in FIG. 6.

At operation 15, the hard mask 34 is patterned. In certain embodiments in which the hard mask 34 includes an intermetal layer 35 and a silicon-containing layer 37 over the intermetal layer 35, patterning the hard mark includes a first etch process to pattern the silicon-containing layer 37 and a second etch process to pattern the intermetal layer 35.

Figure 7:
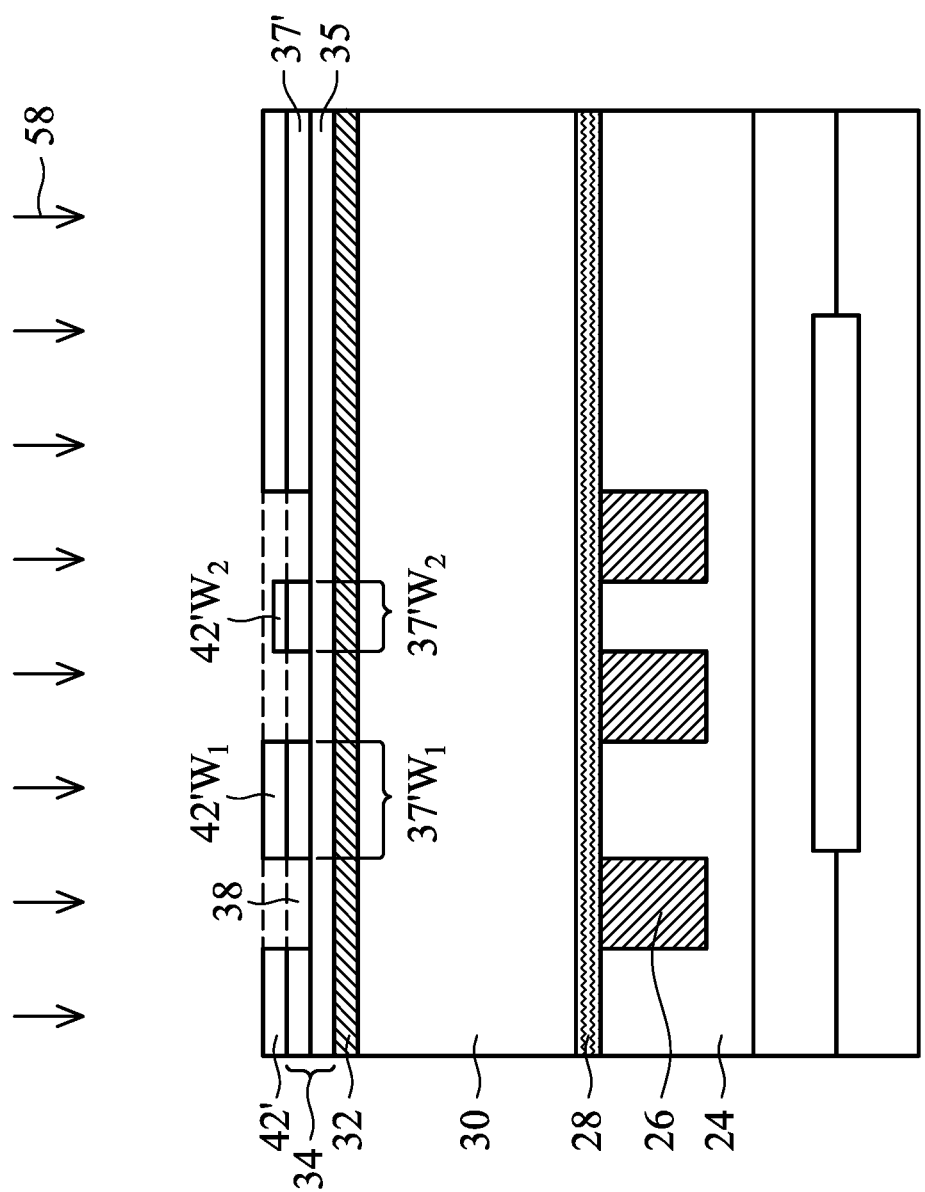

An etch process 58 is performed on the silicon-containing layer 37 using the patterned dense middle layer 44' and the patterned bottom layer 42' as an etching mask as shown in FIG. 7, in accordance with some embodiments. The etch process 58 may involve a plasma process, such as an inductively coupled plasma (ICP), parallel plate plasma, ion beam etching (IBE), or reactive ion beam etching (RIBE) plasma process. One example of the etch process 58 is a plasma etch with $CF_4$, $C_4F_6$, and/or $C_4F_8$ etching gas at a chamber pressure in a range from about 10 mTorr to about 50 mTorr, a source RF power in range from about 100 W to about 1000 W, a bias power in range from about 50V to about 500V, and a wafer temperature in a range from about 20° C. to about 80° C., and a high/low frequency power ratio in a range from about 2:1 to about 10:1. The silicon-containing layer 37 is patterned (e.g., etched) to form openings 38 in the patterned silicon-containing layer 37', in accordance with some embodiments. The silicon-containing layer 37 is etched through the openings 45 in the patterned dense middle layer 44' and through the openings 43 in the patterned bottom layer 42' to form openings 38 in the patterned silicon-containing layer 37' to expose the intermetal layer 35. A dotted line schematically represents the removal of portions of the silicon-containing layer 37 to form the openings 38. During the etch process 58 of the silicon-containing layer 37, the patterned dense middle layer 44' is entirely consumed. During the etch process 58 of the silicon-containing layer 37, the patterned bottom layer 42' may be partially or entirely consumed. For example, due to the narrower width of pattern 42'$W_2$, the height of pattern 42'$W_2$ may be shorter than pattern 42'$W_1$. The patterned silicon-containing layer 37' may include patterns 37W with different widths. For example, pattern 37$W_1$ is formed to a greater width than patterning 37$W_2$ as shown in FIG. 7.

Figure 8:
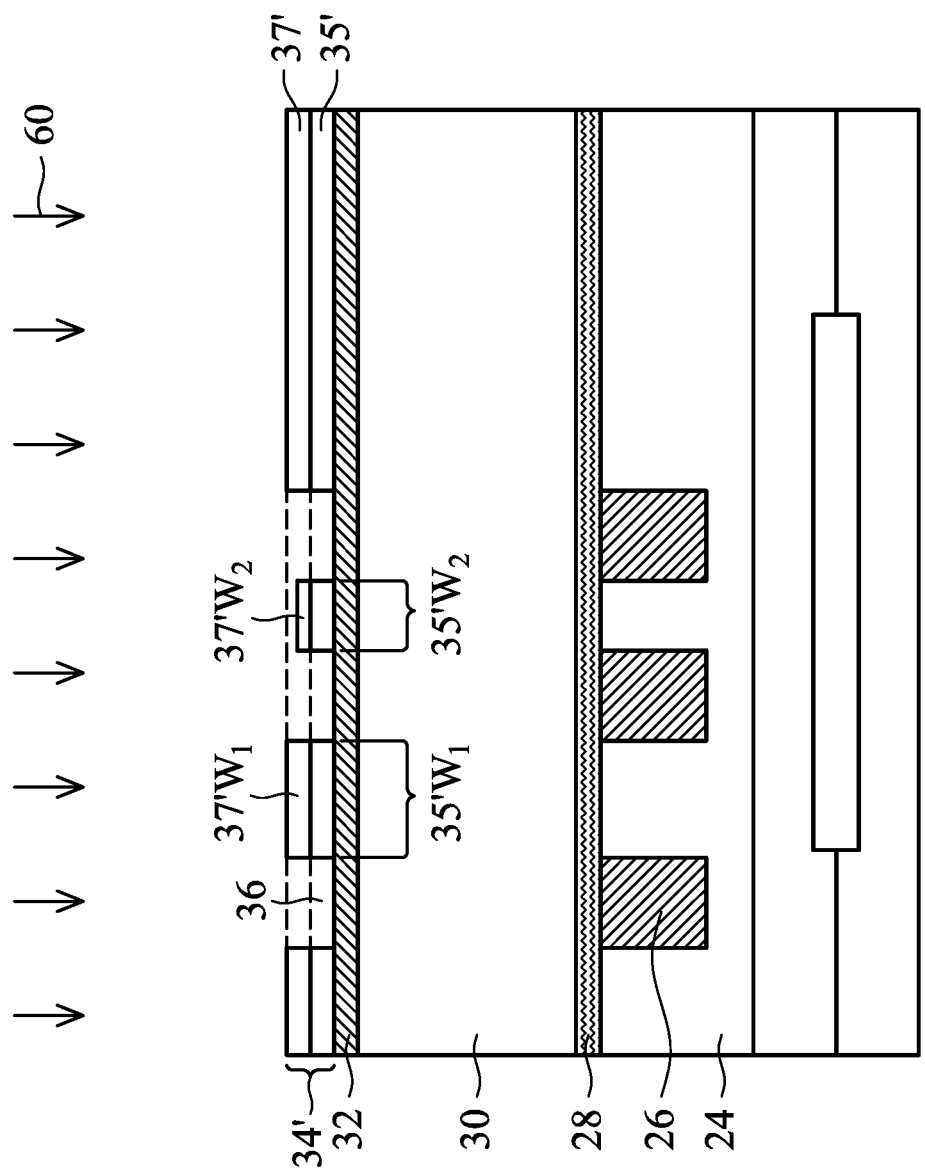
Figure 9:
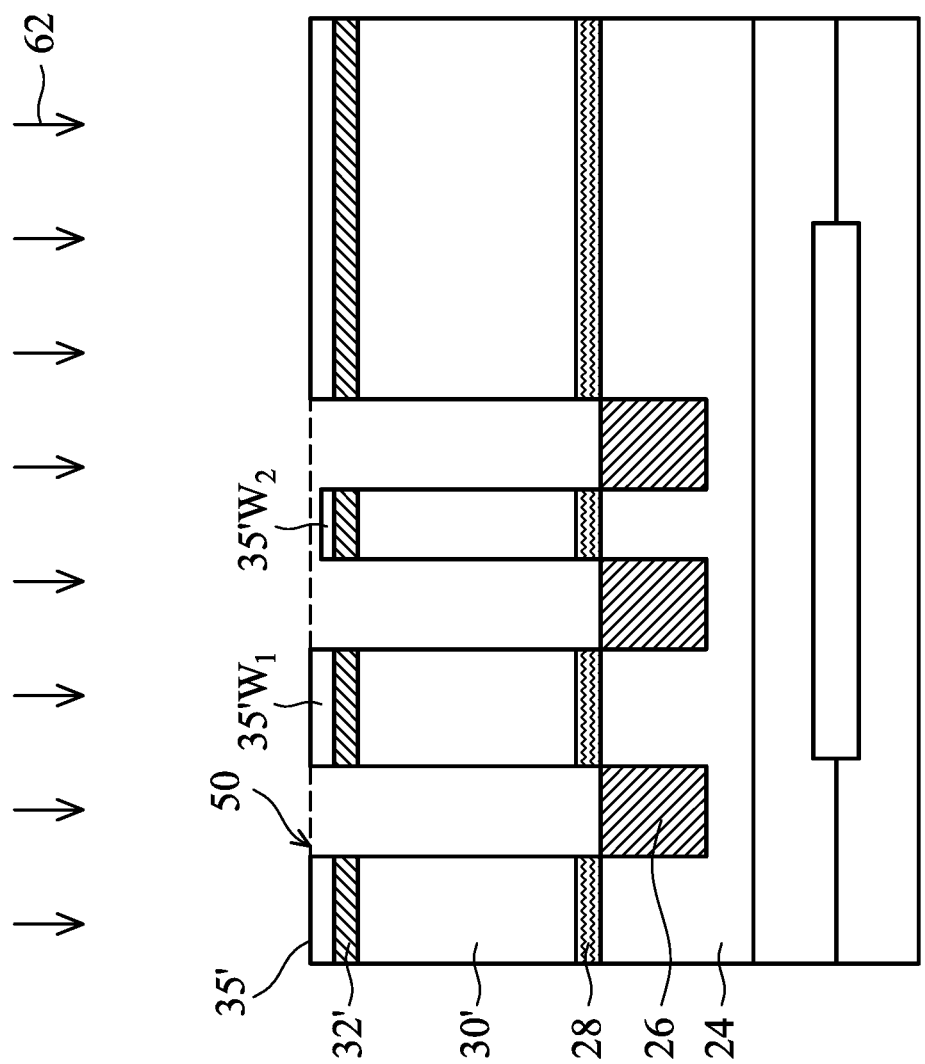

An etch process 60 is performed on the intermetal layer 35 using the patterned silicon-containing layer 37' as an etching mask as shown in FIG. 8 to form a patterned hard mask 34', in accordance with some embodiments. The etch process 60 may involve a plasma process, such as an inductively coupled plasma (ICP), parallel plate plasma, ion beam etching (IBE), or reactive ion beam etching (RIBE) plasma process. One example of the etch process 58 is a plasma etch with a fluorine containing gas, such as $CF_4$ and/or $CHF_3$, with a carbon containing gas, such as $CH_4$, and with a chlorine containing gas, such as $Cl_2$. One example of the etch chamber conditions of the etch process 58 includes a chamber pressure in a range from about 10 mTorr to about 60 mTorr, a source RF power in a range from about 100 W to about 2000 W, a bias power in a range from 0V to about 500V, and a wafer temperature in a range from about 20° C. to about 80° C. The intermetal layer 35 is patterned (e.g., etched) to form openings 36 in the patterned intermetal layer 35', in accordance with some embodiments. The intermetal layer 35 is etched through the openings 38 in the silicon-containing layer 37' to form openings 36 in the patterned intermetal layer 35' to expose the layer underneath, such as the ARC layer 32 as shown in FIG. 8. A dotted line schematically represents the removal of portions of the intermetal layer 35 to form the openings 36. During the etch process 60 of the intermetal layer 35, the patterned silicon-containing layer 37' may be partially or entirely consumed. For example, due to the narrower width of pattern 37'$W_2$, the height of pattern 37'$W_2$ may be shorter than pattern 37'$W_1$. The patterned intermetal layer 35' may include patterns 35'W with different widths. For example, pattern 35'$W_1$ is formed to a greater width than patterning 35'$W_2$ as shown in FIG. 8. At operation 16, the second dielectric layer 30 is etched through the patterned hard mask 34'. An etch process 62 is performed using the patterned hard mask 34' as an etching mask as shown in FIG. 9, in accordance with some embodiments. The etch process 62 etches through the ARC layer 32 and the second dielectric layer 30, to from openings 50 through the ARC layer 32 and the dielectric layer 30. During the etch process 62, any remaining silicon-containing layer 37 is entirely consumed. During the etch process 62, the patterned intermetal layer 35' may be partially or entirely consumed. For example, due to the narrower width of pattern 35'W$_2$, the height of pattern 35'W$_2$ may be shorter than pattern 35'W$_1$. An additional etch process may be performed to etch through the ESL 28.

Figure 10:
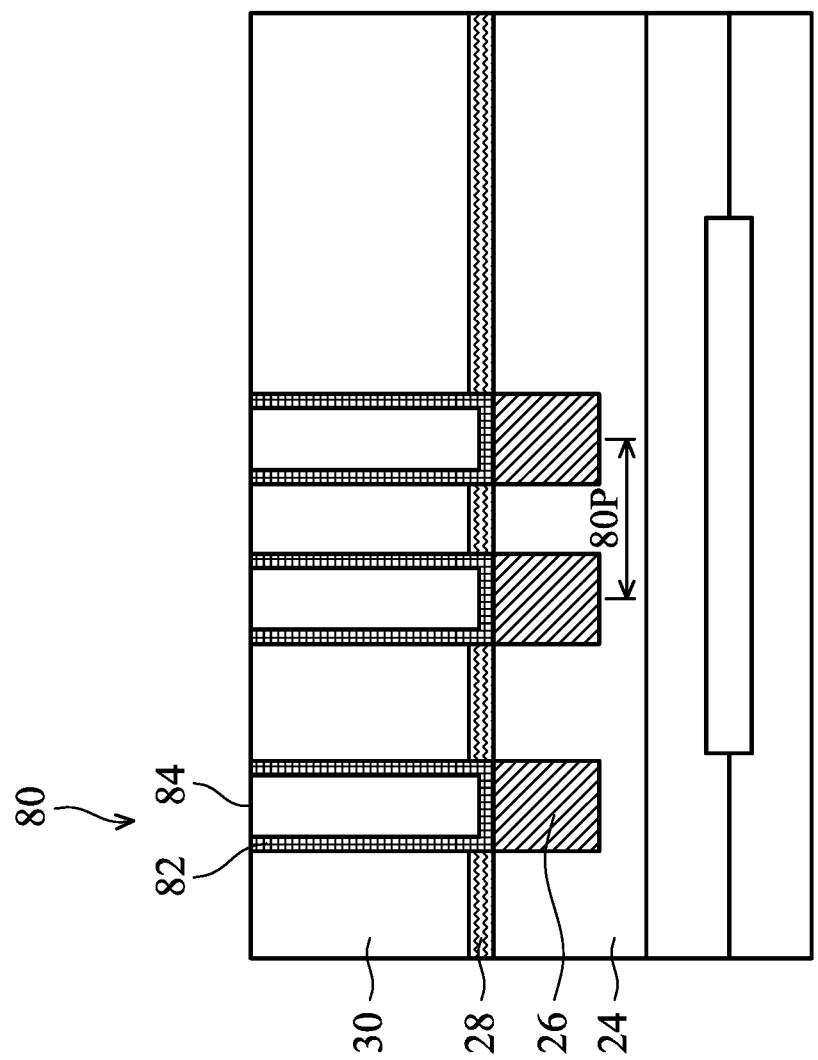

Conductive features 80, such as vias and contacts, are formed within openings 50 as shown in FIG. 10, in accordance with certain embodiments. The conductive features 80 may include liners 82, such as diffusion barrier layers, adhesion layers, and/or the like. Examples of liners 82 include titanium, titanium nitride, tantalum, tantalum nitride, or other alternatives. The conductive features 80 include a metal fill 84 deposited as in operation 17. Examples of metal fill 84 include as copper, silver, gold, tungsten, aluminum, and alloys thereof. Liners 82 and the metal fill 84 may be deposited by PVD, electrochemical deposition, CVD, other suitable deposition processes, or combinations thereof. A planarization process, such as chemical mechanical planarization (CMP) or an etch process, is performed to level the surface of the conductive features 80 and to remove excess conductive materials from the top surface of second dielectric layer 30. The patterned intermetal layer 35' may be removed in the planarization or etched after the planarization. The multi-layer structure 40 may be used to pattern a hard mask 34 to form conductive features 26 having a pitch 80P of about 40 nm or smaller, such as in a range from about 35 nm to about 10 nm.

The process 10 of FIG. 1 may further include additional operation, such as an ashing process to remove a layer or to remove a partially remaining patterned layer. For example, an ashing process may include an oxygen plasma (such as O$_2$ plasma or O$_3$ plasma) to remove a partially remaining patterned layer containing carbon, such as the patterned top layer 48' and/or the patterned bottom layer 42'.

Some embodiments as described herein are directed to a multiple patterning method for forming conductive features having a small pitch. A multi-layer structure, such as a tetra-layer structure, is provided. The multi-layer structure includes a dense middle layer including a SiC$_x$H$_y$O$_z$ material. The dense middle layer provides high etch selectivity in comparison to a bottom layer of the multi-layer structure. The multi-layer structure may be used to pattern a hard mask, such as a multi-layer hard mask. The multi-layer structure including a dense middle layer reduces over etching and/or under etching issues of patterning the multi-layer structure caused by loading differences of the multi-layer structure over various areas of the substrate having different density of features. Accordingly, some embodiments can improve patterning of patterns having different widths. The multi-layer structure including a dense middle layer reduces pattern bridges or missing patterns of subsequent patterning operations.

An embodiment is a method of fabricating a semiconductor structure. The method includes depositing a hard mask. A multi-layer structure is deposited over the hard mark. The multi-layer structure includes a bottom layer, a first middle layer over the bottom layer, a second middle layer over the first middle layer, and a top layer over the second middle layer. The first middle layer includes a SiC$_x$H$_y$O$_z$ material in which the SiC$_x$H$_y$O$_z$ material has a silicon-to-silicon bond content in a range from about 0.5% to about 5%. The multi-layer structure is patterned to form a patterned first middle layer having openings. The hard mask is etched through the openings in the patterned first middle layer.

Another embodiment is another method of fabricating a semiconductor structure. The method includes forming a multi-layer structure over a hard mask layer. The multi-layer structure includes a bottom layer, a first middle layer over the bottom layer, and a top layer over the first middle layer. The top layer includes a photoresist material. The top layer is patterned with a photolithography process to form openings. The first middle layer is etched to form a patterned first middle layer having openings forming sidewall taper angles in a range from about 70° to about 90°. The hard mask is etched through the openings in the patterned first middle layer.

Yet another embodiment is yet another method of fabricating a semiconductor structure. The method includes forming a multi-layer hard mask comprising an intermetal layer and a silicon-containing layer over the intermetal layer. A multi-layer structure is formed over the multi-layer hard mask. The multi-layer structure includes a bottom layer, a first middle layer having a thickness in a range from about 50 Å to about 300 Å over the bottom layer, and a top photoresist layer over the first middle layer. The top photoresist layer is patterned with a photolithography process to form a patterned top photoresist layer. A descum process is performed over the patterned top photoresist layer. The first middle layer is etched through the patterned top photoresist layer to form a patterned first middle layer having openings to the bottom layer. The first middle layer includes a material with an etch selectivity of five or more in comparison to the bottom layer during the etching of the first middle layer. The bottom layer is etched through the openings in the patterned first middle layer to form a patterned bottom layer having openings to the silicon-containing layer. The silicon-containing layer is etched through the openings in the first middle layer and through the openings in the bottom layer to form a patterned silicon-containing layer having openings to the intermetal layer. The intermetal layer is etched through openings in the patterned silicon-containing layer to form a patterned intermetal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, the method comprising:
   depositing a hard mask over a substrate;
   depositing a multi-layer structure over the hard mask, the multi-layer structure comprising a bottom layer, a first middle layer over the bottom layer, a second middle layer over the first middle layer, a top layer over the second middle layer, wherein the first middle layer comprises a SiC$_x$H$_y$O$_z$ material, the SiC$_x$H$_y$O$_z$ material having a silicon-to-silicon bond content in a range from about 0.5% to about 5%; and
   patterning the multi-layer structure to form a patterned first middle layer having openings; and
   etching the hard mask through the openings in the patterned first middle layer.

2. The method of claim 1, wherein the first middle layer is deposited by a plasma enhanced chemical vapor deposition process at a process temperature in a range from about 50° C. to about 350° C. and in a process pressure in a range from about 0.5 torr to about 20 torr.

3. The method of claim 1, wherein the first middle layer is deposited by a chemical vapor deposition process, the chemical vapor deposition process comprising flowing a silicon precursor, a carbon precursor, and an oxygen precursor.

4. The method of claim 3, wherein the silicon precursor is selected from a group consisting of silane ($SiH_4$), disilane ($Si_2H_4$), trisilane ($Si_2H_4$), and a combination thereof.

5. The method of claim 3, wherein the carbon precursor is selected from the group consisting of tetraethyl orthosilicate (TEOS), dimethyldiethoxysilane (mDEOS), methane ($CH_4$), ethane ($C_2H_6$), propane ($C_3H_8$), α-Terpinene, trimethylsilane ($C_3H_{10}Si$), tetramethylsilane ($C_4H_{12}Si$), benzene ($C_6H_6$), and a combination thereof.

6. The method of claim 1, wherein the first middle layer is deposited by an atomic layer deposition process, the atomic layer deposition process comprises flowing a silicon-carbon precursor in a first pulse and flowing an oxygen precursor in a second pulse.

7. The method of claim 6, wherein the silicon-carbon precursor comprises bis-diethylamino-silane ($SiH_2[N(C_2H_5)_2]_2$).

8. The method of claim 6, wherein the atomic layer deposition process comprises a plasma-enhanced atomic layer deposition process.

9. A method of fabricating a semiconductor structure, the method comprising:
   forming a multi-layer structure over a hard mask layer, the multi-layer structure comprising a bottom layer, a first middle layer over the bottom layer, a second middle layer over the first middle layer, a top layer over the second middle layer, wherein the top layer comprises a photoresist material, wherein the first middle layer and the second middle layer comprise silicon-containing materials, wherein the second middle layer has a lower silicon-to-silicon bond content than the first middle layer;
   patterning the top layer with a photolithography process to form openings;
   etching the first middle layer to form a patterned first middle layer having openings forming sidewall taper angles in a range from about 70° to about 90°; and
   etching the hard mask layer through the openings in the patterned first middle layer.

10. The method of claim 9, wherein the patterned top layer comprises a Si—O—Si backbone.

11. The method of claim 9, the first middle layer comprises a SiCxHyOz material deposited by plasma enhanced CVD or plasma-assisted ALD.

12. The method of claim 11, wherein the top layer is deposited by a spin-on process.

13. The method of claim 12, wherein the bottom layer is deposited by a spin-on process.

14. The method of claim 13, wherein the top layer and the bottom layer comprise a $C_xH_yO_z$ material.

15. A method of fabricating a semiconductor structure, the method comprising:
   forming a multi-layer hard mask comprising an intermetal layer and a silicon-containing layer over the intermetal layer;
   forming a multi-layer structure over the multi-layer hard mask, the multi-layer structure comprising a bottom layer, a first middle layer having a thickness in a range from about 50 Å to about 300 Å over the bottom layer, and a top photoresist layer over the first middle layer;
   patterning the top photoresist layer with a photolithography process to form a patterned top photoresist layer;
   performing a descum process over the patterned top photoresist layer;
   etching the first middle layer through the patterned top photoresist layer to form a patterned first middle layer having openings to the bottom layer, wherein the first middle layer comprises a material with an etch selectivity of five or more in comparison to the bottom layer during the etching of the first middle layer;
   etching the bottom layer through the openings in the patterned first middle layer to form a patterned bottom layer having openings to the silicon-containing layer;
   etching the silicon-containing layer through the openings in the first middle layer and through the openings in the bottom layer to form a patterned silicon-containing layer having openings to the intermetal layer; and
   etching the intermetal layer through openings in the patterned silicon-containing layer to form a patterned intermetal layer.

16. The method of claim 15, wherein after the etching the bottom layer, at least a portion of the patterned first middle layer remains.

17. The method of claim 15, further comprising etching a dielectric layer through the openings of the patterned intermetal layer to form a patterned dielectric layer having openings.

18. The method of claim 17, wherein the openings of the patterned dielectric layer are to conductive features.

19. The method of claim 17, further comprising depositing a metal fill in the openings in the patterned dielectric layer.

20. The method of claim 19, wherein the metal fill has a pitch in a range of about 40 nm or less.

* * * * *